(12) United States Patent
Nosaka et al.

(10) Patent No.: US 12,272,941 B2
(45) Date of Patent: Apr. 8, 2025

(54) OVERCURRENT PROTECTION CIRCUIT AND POWER CONVERTER

(71) Applicant: OMRON Corporation, Kyoto (JP)

(72) Inventors: Noriyuki Nosaka, Kyoto (JP); Hironori Tauchi, Kyoto (JP); Takuro Hashimoto, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 151 days.

(21) Appl. No.: 18/042,622

(22) PCT Filed: Aug. 20, 2021

(86) PCT No.: PCT/JP2021/030651
§ 371 (c)(1),
(2) Date: Feb. 23, 2023

(87) PCT Pub. No.: WO2022/054546
PCT Pub. Date: Mar. 17, 2022

(65) Prior Publication Data
US 2023/0361555 A1 Nov. 9, 2023

(30) Foreign Application Priority Data
Sep. 10, 2020 (JP) .................. 2020-152063

(51) Int. Cl.
*H02H 7/12* (2006.01)
(52) U.S. Cl.
CPC .................. *H02H 7/12* (2013.01)
(58) Field of Classification Search
CPC ........ H02H 7/12; H02H 7/1227; H02H 3/087; H02M 1/0009; H02M 1/08; H02M 1/32; H03K 17/08122; H03K 17/0822
(Continued)

(56) References Cited

U.S. PATENT DOCUMENTS

| 4,893,158 A | * | 1/1990 | Mihara | ................ H01L 27/0623 |
| | | | | 257/341 |
| 2011/0204929 A1 | * | 8/2011 | Nakayama | ............... H02M 1/08 |
| | | | | 327/109 |

(Continued)

FOREIGN PATENT DOCUMENTS

| JP | S6467972 A | 3/1989 |
| JP | H11289774 A | 10/1999 |

(Continued)

OTHER PUBLICATIONS

International Search Report issued in Intl. Appln. No. PCT/JP2021/030651 mailed Sep. 21, 2021. English translation provided.

(Continued)

*Primary Examiner* — Thienvu V Tran
*Assistant Examiner* — Sreeya Sreevatsa
(74) *Attorney, Agent, or Firm* — ROSSI, KIMMS & McDOWELL LLP

(57) ABSTRACT

An overcurrent protection circuit includes a first switching element including a fourth terminal, a sixth terminal connected to a first terminal, and a fifth terminal, and a second switching element including a seventh terminal connected to the fifth terminal, an eighth terminal connected to the fourth terminal, and a ninth terminal. The first switching element electrically connects the sixth terminal and the fifth terminal in response to detecting a voltage value between the first terminal and a third terminal of the switching device exceeding a predetermined threshold based on the predetermined threshold voltage input into the fourth terminal. The second switching element electrically connects, in response to the sixth terminal and the fifth terminal of the first switching element being electrically connected to each other, the eighth terminal and the ninth terminal to lower the prede- (Continued)

termined threshold voltage input into the fourth terminal of the first switching element.

5 Claims, 9 Drawing Sheets

(58) Field of Classification Search
USPC .......................................................... 361/101
See application file for complete search history.

(56) References Cited

U.S. PATENT DOCUMENTS

| | | | |
|---|---|---|---|
| 2021/0226620 A1* | 7/2021 | Nakada | H02M 1/08 |
| 2021/0242864 A1* | 8/2021 | Okada | H02M 3/156 |

FOREIGN PATENT DOCUMENTS

| | | |
|---|---|---|
| JP | 2016201693 A | 12/2016 |
| JP | 2020017882 A | 1/2020 |
| JP | 2020127267 A | 8/2020 |

OTHER PUBLICATIONS

Written Opinion issued in Intl. Appln. No. PCT/JP2021/030651 mailed Sep. 21, 2021. English translation provided.
Extended European Search Report issued in European Appln. No. 21866506.5 mailed Jul. 5, 2024.

* cited by examiner

OVERCURRENT PROTECTION CIRCUIT AND POWER CONVERTER

TECHNICAL FIELD

The present invention relates to an overcurrent protection circuit for a power converter and to a power converter.

BACKGROUND

A known form of overcurrent protection for switching devices included in power converters is described in, for example, Patent Literature 1.

A switching circuit 40 including an overcurrent protection circuit 20 described in Patent Literature 1 detects an overcurrent in a switching element SW1 and provides overcurrent protection. The overcurrent protection circuit 20 includes a current detector (current transformer, or CT) that detects an overcurrent flowing through the switching element SW1, and an overcurrent detection circuit 2 that generates a control signal DET_oc for turning on or off a switching element SW2 based on whether the current flowing through the switching element SW1 detected with the current detector CT exceeds a threshold Ith. The overcurrent detection circuit 2 provides overcurrent protection for the switching element SW1 by turning on or off the switching element SW2 through a resistance R2 set to cause a turn-off time T2 of the switching element SW1 resulting from the switching element SW2 being turned on in response to the control signal DET_oc to be longer than a turn-off time T1 of the switching element SW1.

RELATED ART DOCUMENTS

Patent Documents

Patent Literature 1: Japanese Unexamined Patent Application Publication No. 2020-17882

SUMMARY

Technical Problem

As described in Patent Literature 1, this form of overcurrent protection using the current detector CT detecting an overcurrent flowing through a switching device allows the switching device to be on or off based on a current value detected with the current detector and on a preset threshold. Although this form of overcurrent protection using a CT scheme is highly versatile, the response time taken from when an overcurrent is detected to when the switching device is turned on or off depends on the response speed of the current detector. This may cause a large operational delay.

Another form of overcurrent protection uses a desaturation (DESAT) scheme that detects an overcurrent flowing through a switching device based on an increase in the device voltage (e.g., drain voltage). This form of overcurrent protection using the DESAT scheme detects an increase in the voltage between a collector and an emitter, or between a drain and a source resulting from an overcurrent in the switching device. Although this form of overcurrent protection is expected to be faster than overcurrent protection using a CT scheme with a current detector (CT), this form of overcurrent protection can interfere with noise contained in the power line. The form of overcurrent protection using the DESAT scheme uses, for example, a noise filter to reduce interference of noise contained in the power line. The filter can cause an operational delay.

In response to this, one or more aspects of the present invention are directed to a technique of an overcurrent protection circuit for detecting an overcurrent flowing through a switching device promptly and providing overcurrent protection.

Solution to Problem

A technique according to an aspect of the present disclosure is directed to an overcurrent protection circuit for a switching device including a first terminal to receive a control signal input into the first terminal, and a second terminal and a third terminal to be electrically connected to each other or electrically disconnected from each other based on the input control signal. The overcurrent protection circuit includes a first switching element including a fourth terminal to receive an input of a predetermined threshold voltage, a sixth terminal connected to the first terminal of the switching device, and a fifth terminal, and a second switching element including a seventh terminal connected to the fifth terminal of the first switching element, an eighth terminal connected to the fourth terminal, and a ninth terminal. The first switching element electrically connects the sixth terminal and the fifth terminal in response to detecting a voltage value between the first terminal and the third terminal of the switching device exceeding a predetermined threshold based on the predetermined threshold voltage input into the fourth terminal. The second switching element electrically connects, in response to the sixth terminal and the fifth terminal of the first switching element being electrically connected to each other, the eighth terminal and the ninth terminal to lower the predetermined threshold voltage input into the fourth terminal of the first switching element.

In response to a gate-source voltage Vgs exceeding a reference voltage (V_b-Vth) applied between a gate terminal G and a source terminal S of a switching device Q1, the overcurrent protection circuit can determine whether an overcurrent has occurred and can start a protective operation for the switching device Q1. A switching element Q2 as an overcurrent protection circuit can shift to an ON state in response to the voltage exceeding the reference voltage (V_b-Vth) to electrically connect the drain and the source. A current flowing between the gate terminal G and the source terminal S of the switching device Q1 is applied to the gate terminal of the switching element Q3 through the drain and the source of the switching element Q2, causing the switching element Q3 to shift to an ON state to electrically connect the drain and the source of the switching element Q3. The overcurrent protection circuit allows the current flowing between the gate terminal G and the source terminal S of the switching device Q1 to be grounded in response to the gate-source voltage Vgs applied between the gate terminal G and the source terminal S of the switching device Q1 exceeding the reference voltage (V_b-Vth). This allows prompt detection of an increase in the gate-source voltage Vgs applied between the gate terminal G and the source terminal S of the switching device Q1 having an overshoot when an overcurrent flows, thus discharging the charge accumulating in the gate-source voltage Vgs to stop the operation of the switching device Q1. The overcurrent protection circuit can thus promptly detect an overcurrent flowing through the switching device Q1 and provide overcurrent protection.

The overcurrent protection circuit according to one aspect of the present disclosure may further include a first resistance having one end connected to the fifth terminal of the first switching element, and a first diode including an anode terminal connected to another end of the first resistance and a cathode terminal connected to the fourth terminal of the first switching element. The first switching element may control a current flowing into the eighth terminal of the second switching element with the sixth terminal and the fifth terminal electrically connected to each other. This allows a portion of the current flowing between the drain and the source of the switching element Q2 to flow between the drain and the source of the switching element Q3 in an ON state through a resistance R2 and a diode D1. The resistance R2 and the diode D1 prevent the switching element Q2 from being clamped at a predetermined voltage value, and lower, to nearly 0 V, the gate-source voltage Vgs of the switching device Q1, which has increased momentarily to a voltage value V_OC due to an overshoot.

The overcurrent protection circuit according to one aspect of the present disclosure may further include a threshold voltage generator including a second resistance connected to one of a positive electrode or a negative electrode of a power supply for generating a control signal to be input into the first terminal, and a first capacitor and a second diode connected in parallel between the second resistance and the other of the positive electrode or the negative electrode of the power supply. The threshold voltage generator may generate the predetermined threshold voltage to be input into the fourth terminal of the first switching element. This structure can adjust the voltage value of the threshold voltage generated through a Zener diode D2 and can maintain the value of the threshold voltage generated by a capacitor C1. A threshold voltage generator 11c includes a resistance R3 to limit the value of a current flowing through the Zener diode D2.

The overcurrent protection circuit according to one aspect of the present disclosure may further include a feedback circuit that detects a voltage decrease resulting from discharge of the predetermined threshold voltage input into the fourth terminal of the first switching element, and stops or starts generation of the control signal to be input into the first terminal. This structure allows the overall operation of a power converter including a switching circuit 1 to stop or start based on, for example, an error signal V_error that is provided as feedback. The operation of the switching device Q1 can be safely stopped when an overcurrent occurs.

In the overcurrent protection circuit according to one aspect of the present disclosure, the first switching element may include a p-type metal-oxide-semiconductor field-effect transistor. The fourth terminal may be a gate terminal, the fifth terminal may be a drain terminal, and the sixth terminal may be a source terminal. The second switching element may include an n-type metal-oxide-semiconductor field-effect transistor. The seventh terminal may be a gate terminal, the eighth terminal may be a drain terminal, and the ninth terminal may be a source terminal. A technique according to another aspect of the present disclosure may be a power converter including the overcurrent protection circuit according to any one of claims 1 to 5. This also allows prompt detection of an increase in the gate-source voltage Vgs applied between the gate terminal G and the source terminal S of the switching device Q1 having an overshoot when an overcurrent flows, thus discharging the charge accumulating in the gate-source voltage Vgs to stop the operation of the switching device Q1. An overcurrent protection circuit 10 can thus promptly detect an overcurrent flowing through the switching device Q1 and provide overcurrent protection.

Advantageous Effects

The overcurrent protection circuit according to the above aspects of the present disclosure can promptly detect an overcurrent flowing through a switching device and provide overcurrent protection.

DETAILED DESCRIPTION

[Example Use]

An example use of the present invention will now be described with reference to the drawings.

Figure 1:
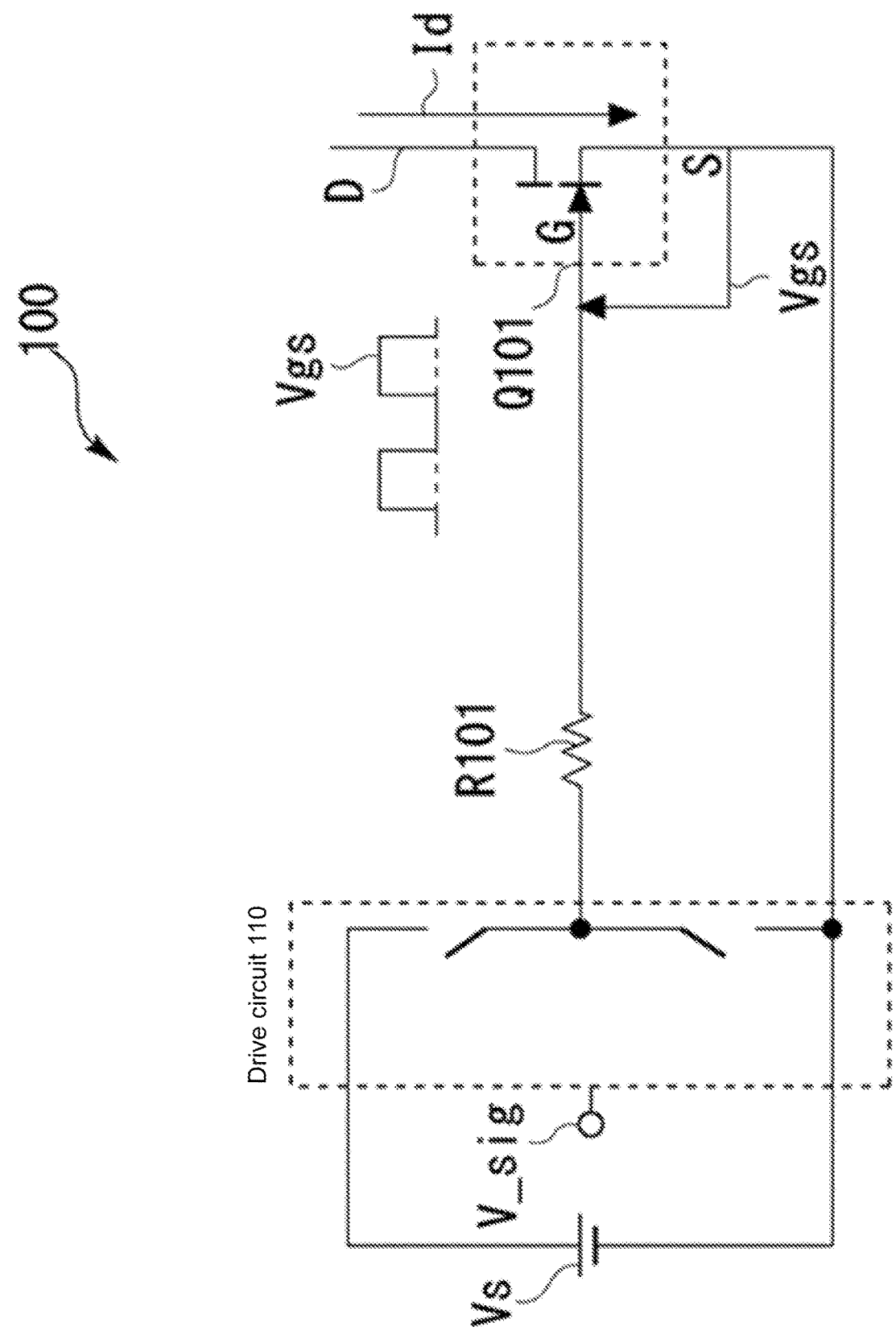
FIG. 1 is a schematic circuit diagram of a switching circuit as a basis for an embodiment of the present invention.

FIG. 1 is a schematic circuit diagram of a switching circuit as a basis for an example use of the present invention. FIG. 1 shows a switching circuit 100 including a switching device Q101 to be protected against an overcurrent in the present example and a drive circuit 110 connected to a gate terminal G of the switching device Q101 through a resistance R101. Examples of the switching device Q101 as a basis for an example use of the present invention include next-generation semiconductor devices, such as an insulated-gate bipolar transistor (IGBT), a SiC semiconductor device, and a GaN semiconductor device that can perform high-speed switching of large power. In particular, GaN devices containing GaN can perform, for example, higher speed switching than other devices. In the field of power converters, GaN devices as switching devices that can perform higher speed switching are expected to be more widespread. However, GaN devices tend to have less short circuit withstand time than other devices such as IGBTs and SiC devices. Thus, known overcurrent protection using a current transformer (CT) scheme or a desaturation (DESAT) scheme involves a large delay before the overcurrent protection becomes effective. The switching device with a short circuit may thus not be protected against an overcurrent and may be damaged.

Figure 2:
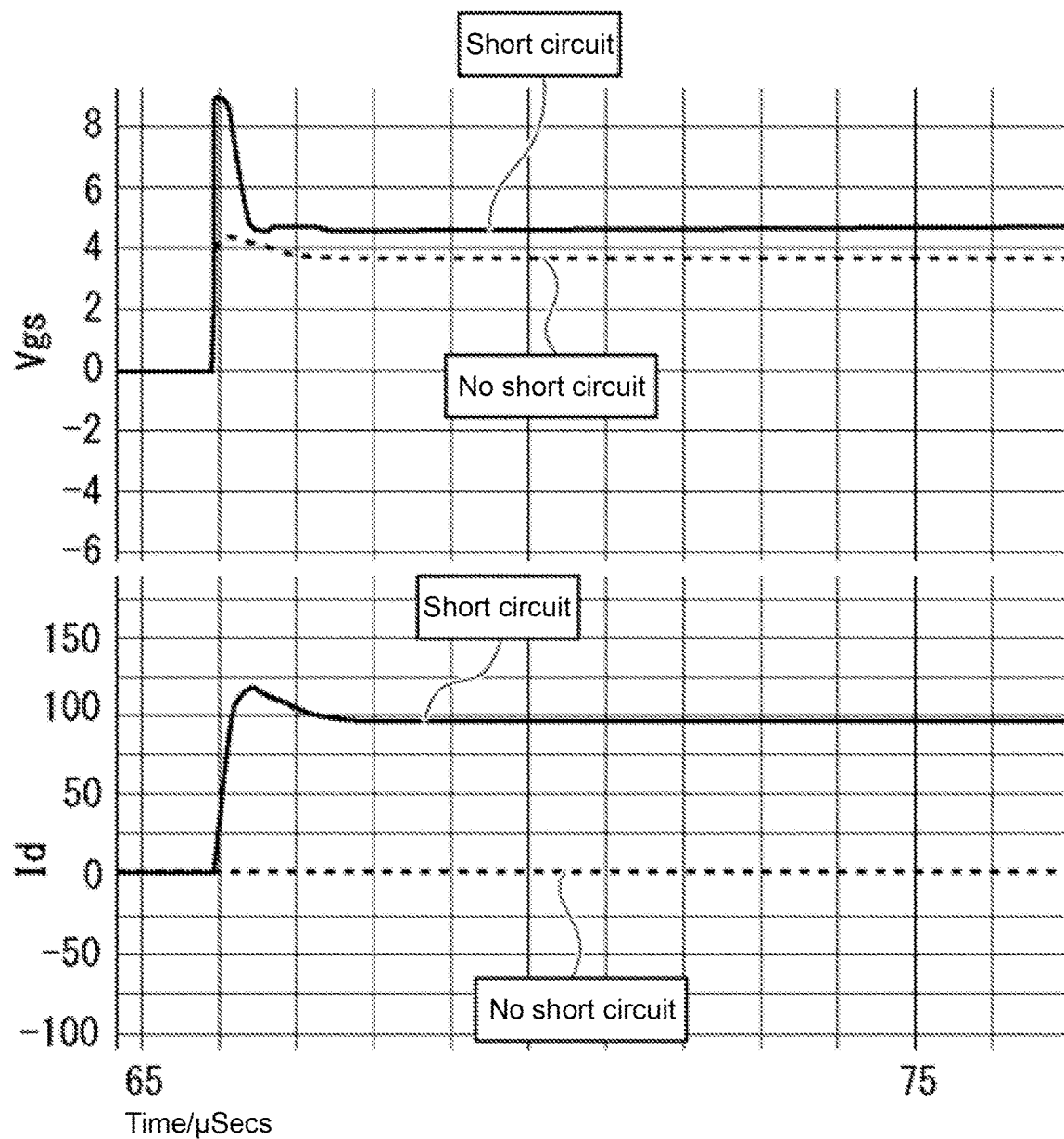
FIG. 2 is a graph showing the operation performed by a switching device with a short circuit as a basis for an embodiment of the present invention.

As shown in FIG. 2, when an overcurrent flows into a drain terminal D of the switching device Q101, the gate-source voltage Vgs applied between the gate terminal G and a source terminal S increases momentarily, causing an overshoot. The overcurrent from other circuit configurations connected to the drain terminal D of the switching device Q101 can flow in, causing a short-circuit breakdown. In a steady state, no overshoot occurs in the gate-source voltage Vgs applied between the gate terminal G and the source terminal S, and the drain current Id flowing between the drain terminal D and the source terminal S is also controlled at a constant value.

Figure 3:
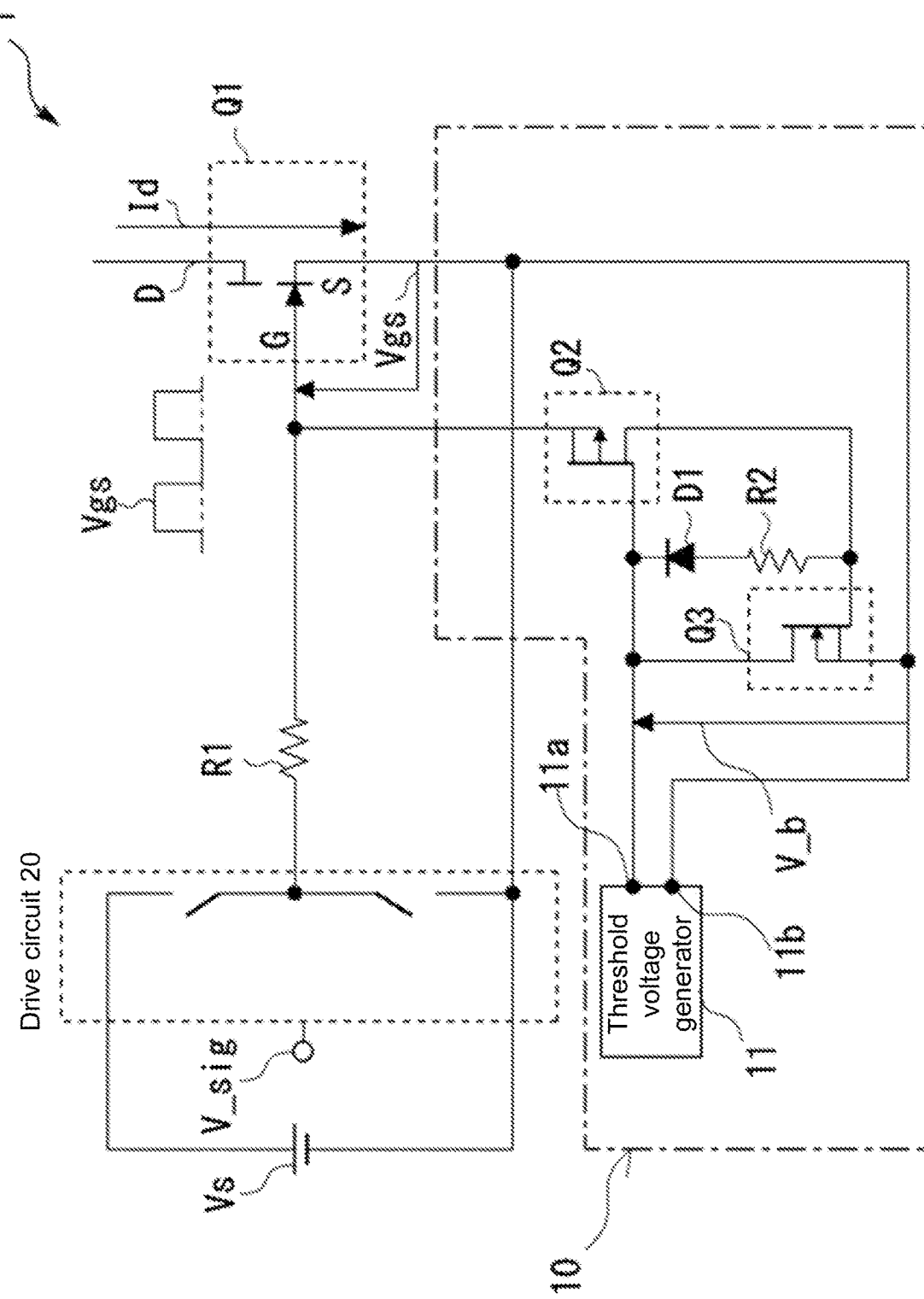
FIG. 3 is a circuit diagram of an overcurrent protection circuit according to a first embodiment of the present invention.
Figure 4:
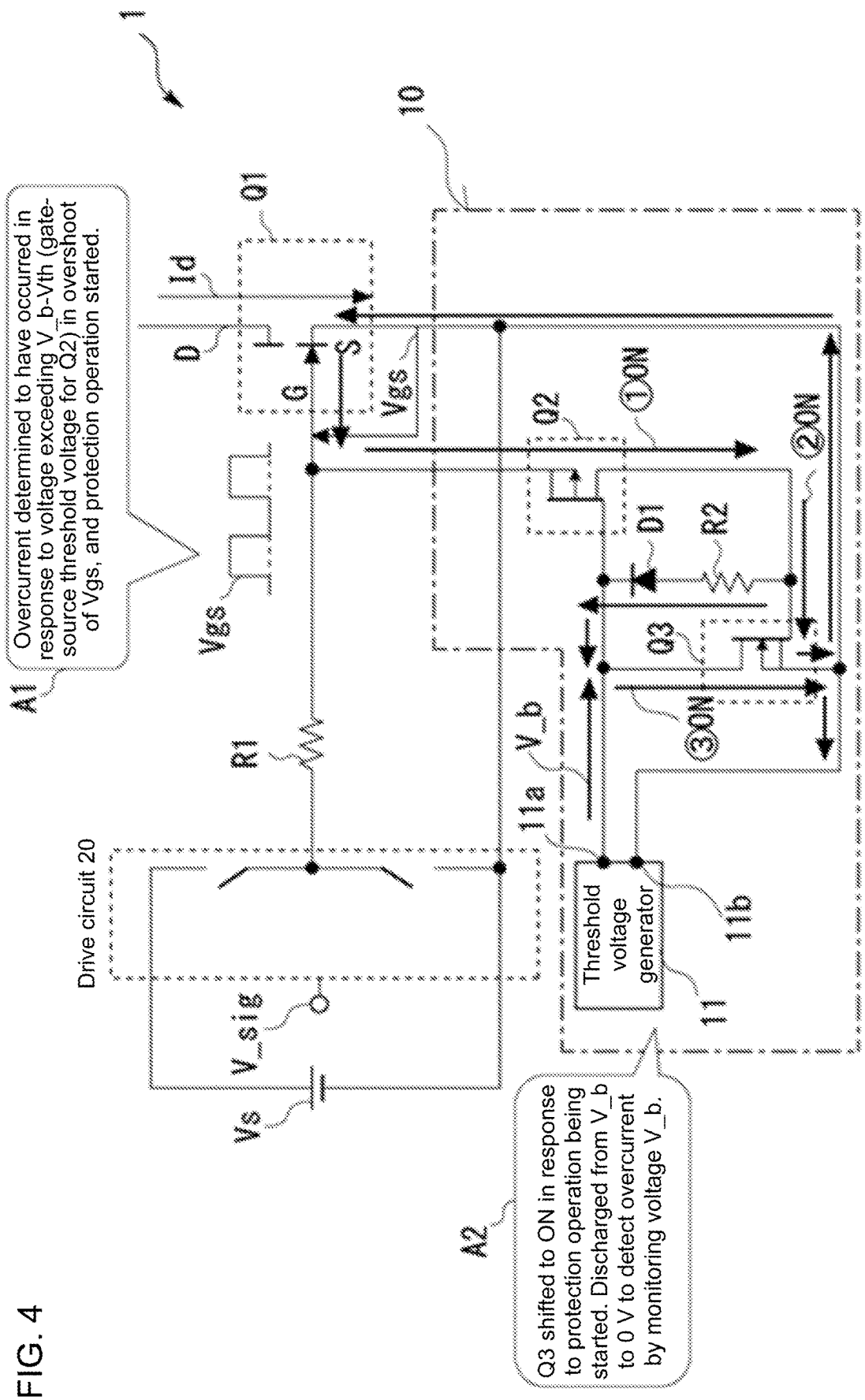
FIG. 4 is a diagram describing a circuit operation performed by the overcurrent protection circuit according to the first embodiment of the present invention.
Figure 5:
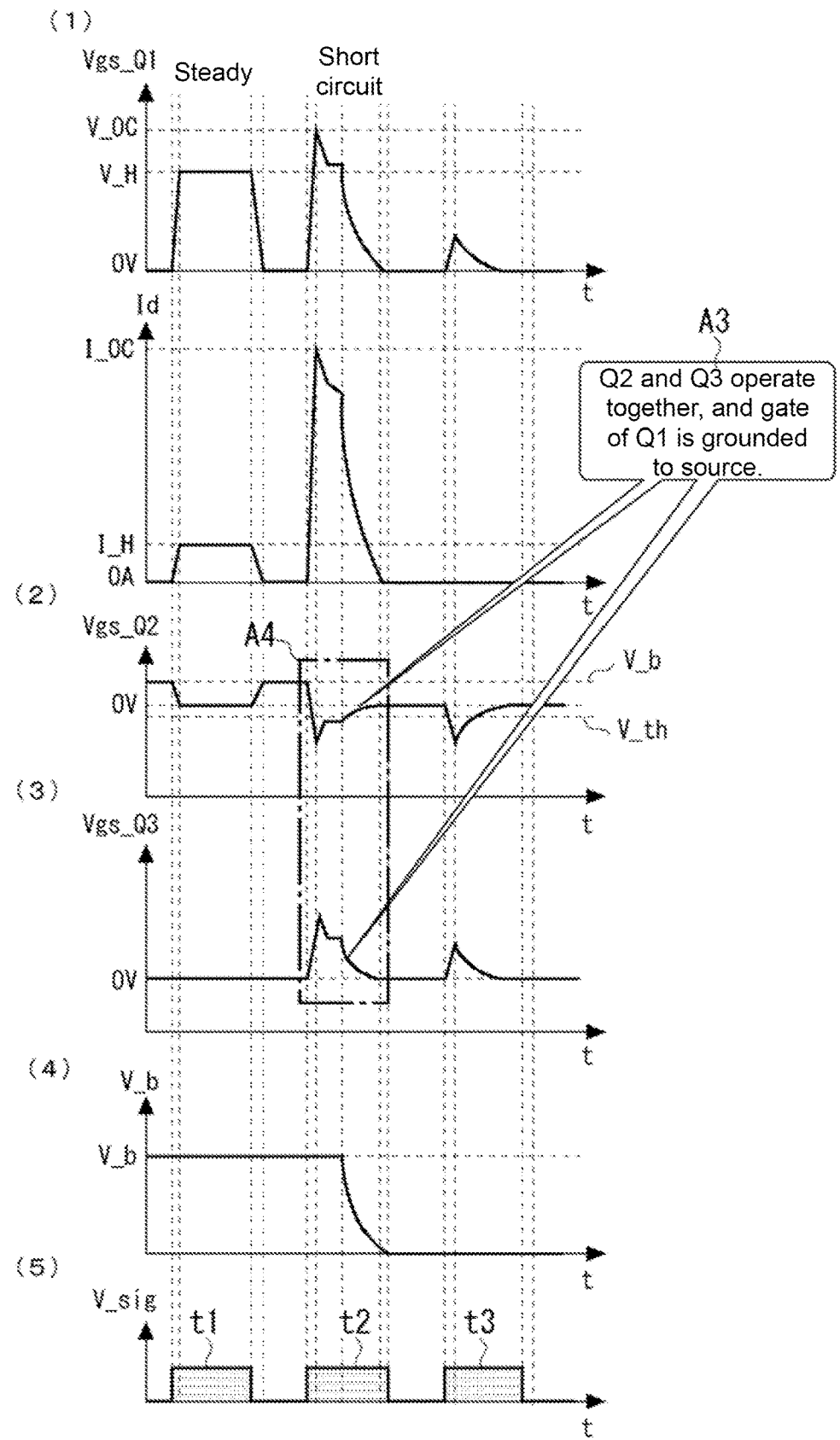
FIG. 5 is a timing chart describing the circuit operation performed by the overcurrent protection circuit according to the first embodiment of the present invention.

As shown in FIGS. 3 to 5, the structure in the present example includes an overcurrent protection circuit 10 to provide protection against an overcurrent flowing between the drain terminal D and the source terminal S of a switching device Q1 based on a voltage difference in the gate-source voltage Vgs between when a short circuit occurs and when no short circuit occurs. The overcurrent protection circuit 10 includes a threshold voltage generator 11, a switching element Q2, a switching element Q3, a resistance R2, and a diode D1 as its components. The switching element Q2 is a p-type metal-oxide-semiconductor field-effect transistor (MOSFET), and the switching element Q3 is an n-type MOSFET. The switching elements Q2 and Q3 function as complementary MOSFETs.

The switching element Q2 has a source terminal connected to the gate terminal G of the switching device Q1, and a drain terminal connected to one end of the resistance R2. The other end of the resistance R2 is connected to an anode terminal of the diode D1, and a cathode terminal of the diode D1 is connected to a gate terminal of the switching element Q2. The switching element Q3 has a drain terminal connected to the gate terminal G of the switching element Q2, and a source terminal connected to the source terminal S of the switching device Q1. The switching element Q3 also has a gate terminal connected to the drain terminal of the switching element Q2. The threshold voltage generator 11 has a terminal 11a connected to the drain terminal of the switching element Q3, and a terminal 11b connected to the source terminal of the switching element Q3. The threshold voltage generator 11 monitors a voltage V_b between the drain terminal and the source terminal of the switching element Q3 and functions to protect the switching device Q1 against an overcurrent flowing between the drain terminal D and the source terminal S of the switching device Q1. The structure according to the present example allows prompt detection of an overcurrent flowing between the drain terminal D and the source terminal S of the switching device Q1, thus providing overcurrent protection over GaN devices that are insufficiently protected by known overcurrent protection provided using the CT scheme or the DESAT scheme.

First Embodiment

Embodiments of the present invention will now be described in more detail with reference to the drawings. The structure according to the embodiments below is merely illustrative. The technique described herein is not limited to the structure according to the embodiments.

Circuit Configuration

FIG. 1 is a schematic circuit diagram of a switching circuit as a basis for an embodiment of the present invention. As shown in FIG. 1, the switching circuit 100 includes the switching device Q101 to be protected against an overcurrent in the present example, and the drive circuit 110 connected to the gate terminal G of the device Q101 through the resistance R101. The resistance R101 limits a gate current flowing through the switching device Q101.

The switching circuit 100 may serve as a power converter included in a power conditioner (PCS) installed in a power supply system operable in cooperation with a utility power grid. The power converter including the switching circuit 100 performs, for example, power conversion to convert direct current (DC) power stored in a storage battery or DC power generated through solar power generation into alternating current (AC) power that is in synchronization with the utility power grid and to convert AC power supplied from the power grid into DC power.

The drive circuit 110 performs pulse width modulation (PWM) control of a drive voltage Vs for driving the switching device Q101 in response to a PWM signal V_sig and generates a gate signal Vgs for turning on or off the switching device Q101 with a predetermined duty ratio. The gate signal Vgs generated in the drive circuit 110 is applied between the gate and the source of the switching device Q101. The switching device Q101 turns on or off connection between the drain and the source based on the binary value of the gate signal Vgs. The switching device Q101 electrically connects, for example, the drain terminal D and the source terminal S in response to a high voltage status of the gate signal Vgs, and electrically disconnects the drain terminal D and the source terminal S in response to a low voltage status of the gate signal Vgs. The switching device Q101 has a drain current Id flowing between the drain terminal D and the source terminal S controlled based on the status of the gate signal Vgs.

Examples of the switching device Q101 include next-generation semiconductor devices, such as an IGBT, a SiC semiconductor, or a GaN semiconductor that can perform high-speed switching of large power. In particular, GaN devices containing GaN can perform, for example, higher speed switching than other devices. In the field of power converters, GaN devices as switching devices that can perform higher speed switching are expected to be more widespread. However, GaN devices tend to have less short circuit withstand time than other devices such as IGBTs and SiC devices when a short circuit occurs. Thus, known overcurrent protection using the CT scheme or the DESAT scheme involves a large delay before the overcurrent protection becomes effective. The switching device with a short circuit may thus not be protected against an overcurrent and may be damaged.

FIG. 2 is a graph showing the operation performed by the switching device Q101 with a short circuit. In FIG. 2, plotted lines represent example changes in the gate-source voltage Vgs applied between the gate terminal G and the source terminal S, and example changes in the drain current Id flowing between the drain terminal D and the source terminal S when a short circuit occurs. In FIG. 2, plotted solid lines represent changes when a short circuit occurs, and plotted broken lines represent changes when no short circuit occurs. In FIG. 2, the horizontal axis indicates time (μs), and the vertical axis represents the gate-source voltage Vgs and the drain current Id.

In the power converter including the switching circuit 100, a short circuit can typically occur between the drain terminal D and the source terminal S from an overcurrent flowing from an external circuit component connected to the drain terminal D of the switching device Q101. As indicated with the solid lines in FIG. 2, the gate-source voltage Vgs applied between the gate terminal G and the source terminal S increases momentarily when an overcurrent flows through the drain terminal D of the switching device Q101, thus causing an overshoot. The overcurrent flowing from an external circuit component connected to the drain terminal D of the switching device Q101 flows through the switching circuit 100 with the drain terminal D and the source terminal S.

As indicated with the broken lines in FIG. 2, the gate-source voltage Vgs applied between the gate terminal G and the source terminal S causes no overshoot in a steady state operation, and the drain current Id flowing between the drain terminal D and the source terminal S is controlled at a constant value.

In the present embodiment, as shown in FIG. 2, the gate-source voltage Vgs is protected against an overcurrent flowing between the drain terminal D and the source terminal S of the switching device Q101 based on a voltage difference in the gate-source voltage Vgs between when a short circuit occurs and when no short circuit occurs. A technique described in the present embodiment allows prompt detection of an overcurrent flowing between the drain terminal D and the source terminal S of the switching device Q101, thus providing overcurrent protection over GaN devices that are insufficiently protected by known overcurrent protection using the CT scheme or the DESAT scheme.

<Circuit Operation>

FIG. 3 is a circuit diagram of the overcurrent protection circuit 10 according to the present embodiment. FIG. 3 shows a switching circuit 1 including the switching device Q1 to be protected against an overcurrent, and a drive circuit 20 connected to a gate terminal G of the device Q1 through a resistance R1. The overcurrent protection circuit 10 according to the present embodiment detects an overcurrent flowing between a drain terminal D and a source terminal S promptly based on a gate-source voltage Vgs of the switching device Q1, and provides overcurrent protection for the switching device Q1. The switching circuit 1, the switching device Q1, the drive circuit 20, and the resistance R1 shown in FIG. 3 correspond to the switching circuit 100, the switching device Q101, the drive circuit 110, and the resistance R101 shown in FIG. 1, and will not be described in detail. In FIG. 3 as well, the gate signal Vgs generated in the drive circuit 20 is applied between the gate terminal G and the source terminal S of the switching device Q1. The switching device Q1 turns on or off connection (electrically connects or disconnects) between the drain terminal D and the source terminal S based on the binary value of the gate signal Vgs. In the present embodiment, the switching device Q1 is an example of a switching device, the gate terminal G of the switching device Q1 is an example of a first terminal, the drain terminal D is an example of a second terminal, and the source terminal S is an example of a third terminal.

As shown in FIG. 3, the overcurrent protection circuit 10 in the present embodiment includes the threshold voltage generator 11, a switching device Q2, a switching device Q3, a resistance R2, and a diode D1 as its components, as indicated with the rectangular box defined using a dot-dash line. To distinguish these switching devices from the switching device Q1 to be protected against an overcurrent, the switching device Q2 and the switching device Q3 included in the overcurrent protection circuit 10 may be hereafter also referred to as the switching element Q2 and the switching element Q3. The switching element Q2 is, for example, a p-type MOSFET. The switching element Q3 is, for example, an n-type MOSFET. The switching element Q2 and the switching element Q3 function as complementary MOSFETs. In the present embodiment, the switching element Q2 is an example of a first switching element, a gate terminal of the switching element Q2 is an example of a fourth terminal, a drain terminal is an example of a fifth terminal, and a source terminal is an example of a six terminal. The switching element Q3 is an example of a second switching element, a gate terminal of the switching element Q3 is an example of a seventh terminal, a drain terminal is an example of an eighth terminal, and a source terminal is an example of a ninth terminal.

In the overcurrent protection circuit 10, the switching element Q2 has its source terminal connected to the gate terminal G of the switching device Q1, and its drain terminal connected to one terminal of the resistance R2. The other end of the resistance R2 is connected to an anode terminal of the diode D1, and a cathode terminal of the diode D1 is connected to the gate terminal of the switching element Q2. In the present embodiment, the resistance R2 is an example of a first resistance, and the diode D1 is an example of a first diode.

In the overcurrent protection circuit 10, the switching element Q3 has its drain terminal connected to the gate terminal of the switching element Q2, and its source terminal connected to the source terminal S of the switching device Q1. The switching element Q3 also has a gate terminal connected to the drain terminal of the switching element Q2. The threshold voltage generator 11 has a terminal 11a connected to the drain terminal of the switching element Q3, and a terminal 11b connected to the source terminal of the switching element Q3. The threshold voltage generator 11 monitors a voltage V_b between the drain terminal and the source terminal of the switching element Q3 and functions to protect the switching device Q1 against an overcurrent flowing between the drain terminal D and the source terminal S of the switching device Q1.

FIG. 4 is a diagram describing a circuit operation performed by the overcurrent protection circuit 10 according to the present embodiment. As stated in a text balloon A1 drawn with a solid line in FIG. 4, the gate-source voltage Vgs applied between the gate terminal G and the source terminal S of the switching device Q1 is monitored in the overcurrent protection circuit 10. More specifically, the overcurrent protection circuit 10 determines that the gate-source voltage Vgs applied between the gate terminal G and the source terminal S exceeds a reference voltage (V_b-Vth) for determining that an overcurrent has occurred in an overshoot resulting from a momentary increase in the gate-source voltage Vgs. The voltage value Vth is a threshold voltage for the switching element Q2. In response to a voltage being less than or equal to the voltage value Vth applied between the gate and the source, the drain and the source of the switching element Q2 are electrically connected. The voltage value V_b is set based on a voltage difference in the gate-source voltage Vgs between when a short circuit occurs and when no short circuit occurs, as described with reference to FIG. 2. The voltage value V_b is a threshold voltage used by the switching element Q2 with the source terminal connected to the gate terminal G of the switching device Q1 to determine that an overshoot has occurred.

In response to the gate-source voltage Vgs applied between the gate terminal G and the source terminal S of the switching device Q1 exceeding the reference voltage (V_b-Vth), the overcurrent protection circuit 10 determines that an overcurrent has occurred. The overcurrent protection circuit 10 thus starts an operation to protect the switching device Q1.

The switching element Q2 shifts to an ON state in response to the gate-source voltage Vgs of the switching device Q1 exceeding the reference voltage (V_b-Vth) to electrically connect the drain and the source (circled number 1 in FIG. 4 indicates being ON). A current flowing between the gate terminal G and the source terminal S of the switching device Q1 is applied to the gate terminal of the switching element Q3 through the drain and the source of the switching element Q2, thus causing the switching element Q3 to shift to an ON state (circled number 2 in FIG. 4 indicates being ON). The switching element Q3 that has shifted to an ON state electrically connects the drain and the source (circled number 3 in FIG. 4 indicates being ON).

A portion of the current flowing between the drain and the source of the switching element Q2 flows into the source terminal S of the switching device Q1 through the resistance R2 and the diode D1 and then through the drain and the source of the switching element Q3 that has shifted to an ON state.

FIG. 5 is a timing chart describing a circuit operation performed by the overcurrent protection circuit 10 according to the present embodiment. The timing chart of FIG. 5 shows changes in various circuit components on the same time axis. A graph (1) in FIG. 5 shows example changes in the gate-source voltage Vgs of the switching device Q1 when an overcurrent flows and example changes in the overcurrent flowing between the drain terminal D and the source terminal S. A graph (2) in FIG. 5 shows example changes in the gate-source voltage Vgs_Q2 of the switching element Q2. A graph (3) in FIG. 5 shows example changes in the gate-source voltage Vgs_Q3 of the switching element Q3. A graph (4) in FIG. 5 shows example changes in the voltage V_b. A graph (5) in FIG. 5 shows example changes in the status (t1 to t3) of the PWM signal V_sig in the drive circuit 20.

The switching device Q1 described with reference to FIG. 5 includes a steady state of the PWM signal V_sig at time t1 and a short-circuited state of the signal at time t2. The PWM signal V_sig at time t3 represents a state immediately after overcurrent protection is provided in the present embodiment.

As shown in the graph (1) in FIG. 5, the gate-source voltage Vgs of the switching device Q1 in a steady state at time t1 fluctuates between the voltage values V_H and 0 V, and the current Id flowing between the drain terminal D and the source terminal S changes between the current values I_H and 0 A. As shown in the graph (2) in FIG. 5, the gate-source voltage Vgs of the switching element Q2 is less than or equal to the reference threshold to maintain an OFF state of the switching element Q2. As shown in the graphs (3) and (4) in FIG. 5, when the switching element Q2 is in an OFF state, the switching element Q3 is also maintained in an OFF state, and the voltage value V_b maintains a predetermined voltage value (voltage value V_b).

When a short-circuited state occurs at time t2, the gate-source voltage Vgs of the switching device Q1 exceeds the voltage value V_H and changes to the voltage value V_OC, causing an overcurrent I_OC flowing between the drain terminal D and the source terminal S.

As shown in a rectangular frame A4 drawn with a dot-dash line and stated in a text balloon A3 drawn with a solid line in FIG. 5, the overcurrent protection circuit 10 determines that the gate-source voltage Vgs applied between the gate terminal G and the source terminal S exceeds the reference voltage (V_b-Vth) for determining that an overcurrent has occurred in an overshoot resulting from a momentary increase in the gate-source voltage Vgs. The switching element Q2 in the overcurrent protection circuit 10 shifts to an ON state in response to the voltage exceeding the reference voltage (V_b-Vth) to electrically connect the drain and the source. A current flowing between the gate terminal G and the source terminal S of the switching device Q1 is applied to the gate terminal of the switching element Q3 through the drain and the source of the switching element Q2, causing the switching element Q3 to shift to an ON state.

A portion of the current flowing between the drain and the source of the switching element Q2 flows between the drain and the source of the switching element Q3 that has shifted to an ON state through the resistance R2 and the diode D1, and is grounded to the terminal 11b of the threshold voltage generator 11.

In the threshold voltage generator 11, the voltage value V_b is discharged and lowered to 0 V through the drain and the source of the switching element Q3 that has shifted to an ON state, as shown in the graph (4) in FIG. 5.

At time t3 immediately after overcurrent protection becomes effective in the present embodiment, the switching elements Q2 and Q3 are maintained in an ON state. Thus, as shown in the graphs (1) and (5) in FIG. 5, despite the status of the signal V_sig being high, a current flowing between the gate terminal G and the source terminal S of the switching device Q1 is grounded through the switching elements Q2 and Q3, causing the gate-source voltage Vgs of the switching device Q1 not to return to the steady-state voltage value V_H. With the switching device Q1 being maintained in an OFF state, the current Id flowing between the drain terminal D and the source terminal S is disconnected.

The overcurrent protection circuit 10 according to the present embodiment determines that an overcurrent has occurred when the gate-source voltage Vgs applied between the gate terminal G and the source terminal S of the switching device Q1 exceeds the reference voltage (V_b-Vth) and can start a protective operation for the switching device Q1. The switching element Q2 included in the overcurrent protection circuit 10 shifts to an ON state in response to the voltage exceeding the reference voltage (V_b-Vth) to electrically connect the drain and the source. A current flowing between the gate terminal G and the source terminal S of the switching device Q1 is applied to the gate terminal of the switching element Q3 through the drain and the source of the switching element Q2, causing the switching element Q3 to shift to an ON state to electrically connect the drain and the source of the switching element Q3. The overcurrent protection circuit 10 according to the present embodiment allows a current flowing between the gate terminal G and the source terminal S of the switching device Q1 to be grounded to the source of the switching element Q3 in response to the gate-source voltage Vgs applied between the gate terminal G and the source terminal S exceeding the reference voltage (V_b-Vth). This allows prompt detection of an increase in the gate-source voltage Vgs applied between the gate terminal G and the source terminal S of the switching device Q1 having an overshoot when an overcurrent flows, thus discharging the charge accumulating in the gate-source voltage Vgs to stop the operation of the switching device Q1. The overcurrent protection circuit 10 can thus promptly detect an overcurrent flowing through the switching device Q1 and provide overcurrent protection.

The overcurrent protection circuit 10 according to the present embodiment allows a portion of the current flowing between the drain and the source of the switching element Q2 to flow between the drain and the source of the switching element Q3 through the resistance R2 and the diode D1. The resistance R2 and the diode D1 prevent the switching element Q2 from being clamped at a predetermined voltage value, and lower, to nearly 0 V, the gate-source voltage Vgs of the switching device Q1, which has increased momentarily to a voltage value V_OC due to an overshoot.

<Second Embodiment>

Figure 6:
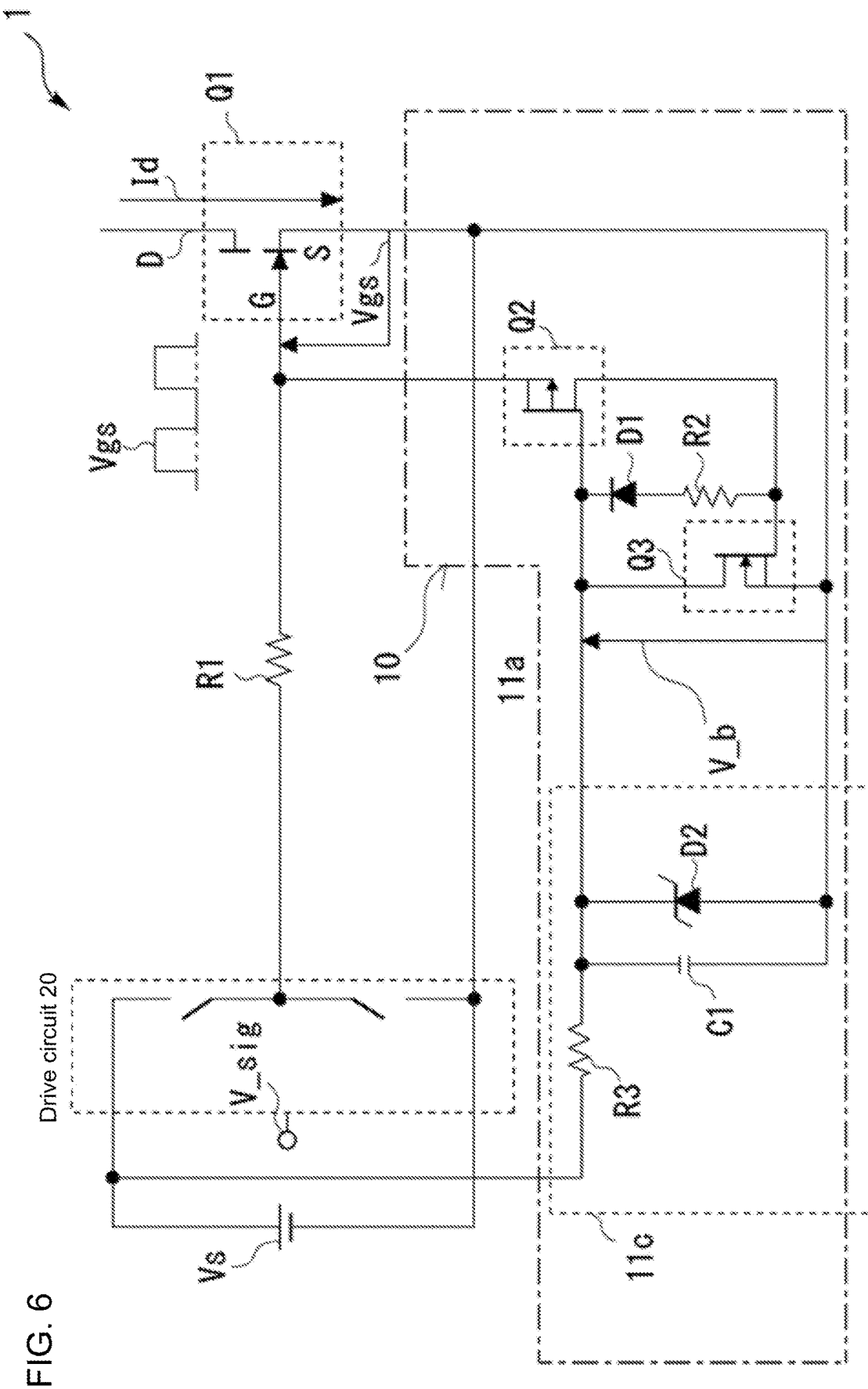
FIG. 6 is a circuit diagram of a threshold voltage generator in a second embodiment of the present invention.

FIG. 6 is a circuit diagram of a threshold voltage generator 11c in a second embodiment. FIG. 6 shows the threshold voltage generator 11c including a resistance R3, a capacitor C1, and a Zener diode D2. As shown in FIG. 6, the resistance R3 has one end connected to a power supply that supplies a drive voltage Vs for driving the switching device Q1, and the other end connected to one end of the capacitor C1. The capacitor C1 has the other end connected to the source terminal of the switching element Q3. The Zener diode D2 has its cathode terminal connected to one end of the resistance R3, and its anode terminal connected to the source terminal of the switching element Q3. In the present embodiment, the resistance R3 is an example of a second resistance, and the Zener diode D2 is an example of a second diode.

An overcurrent protection circuit 10 according to the second embodiment includes the threshold voltage generator 11c to adjust the value of the threshold voltage generated through the Zener diode D2 to maintain the threshold voltage generated by the capacitor C1. The threshold voltage generator 11c includes the resistance R3 to limit the value of a current flowing through the Zener diode D2. In the threshold voltage generator 11c in the second embodiment, the value of the threshold voltage to be generated may be set to, for example, a value several volts higher than the gate-source voltage Vgs of the switching device Q1 in a steady state operation. The threshold voltage generator 11c shown in FIG. 6 is an example of an R-C-ZT circuit that is an analog device, and may be, for example, a circuit using a three-terminal regulator.

<Third Embodiment>

Figure 7:
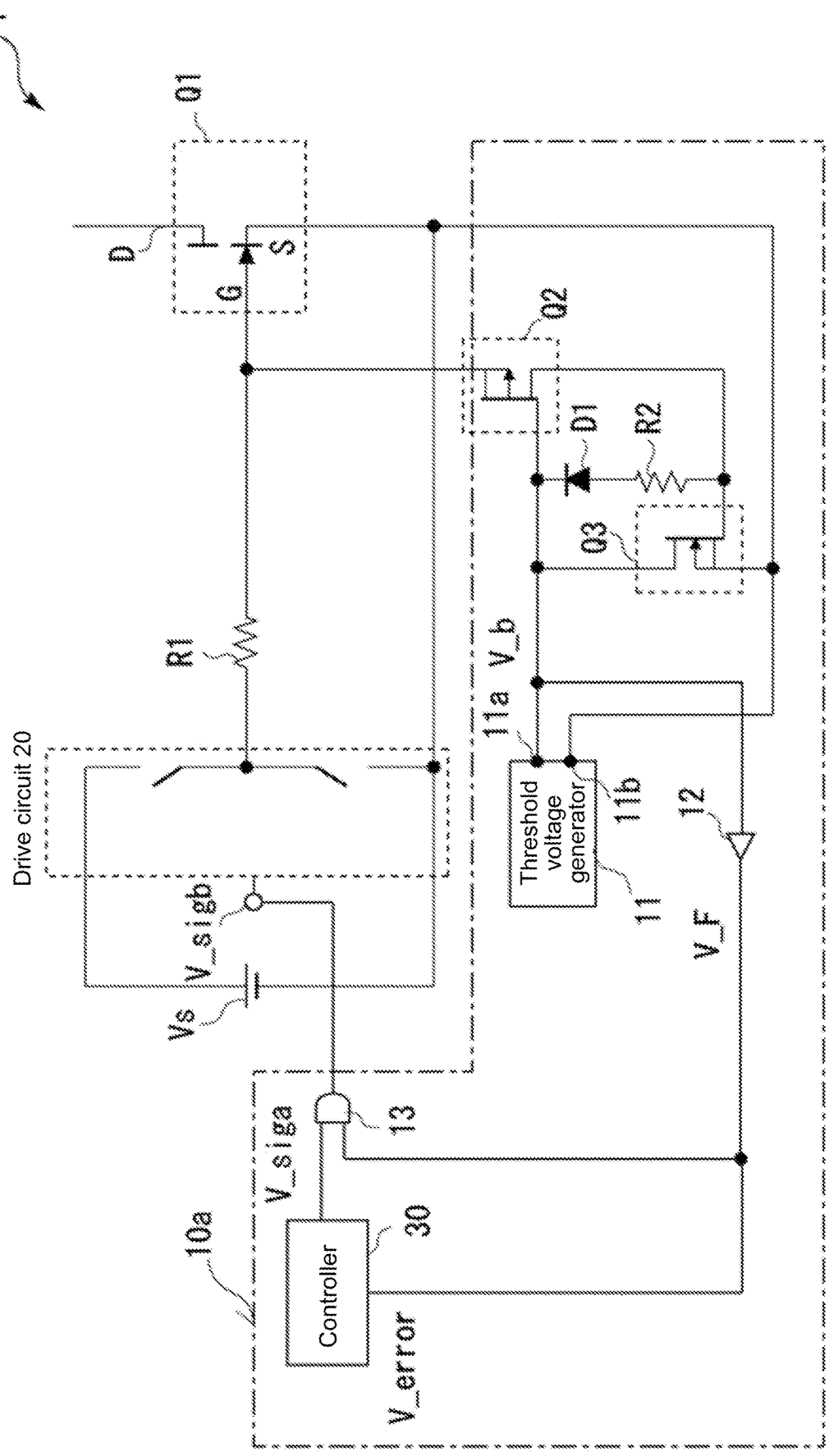
FIG. 7 is a circuit diagram of an overcurrent protection circuit according to a third embodiment of the present invention.

FIG. 7 is a circuit diagram of an overcurrent protection circuit 10a according to a third embodiment. In the circuit configuration shown in FIG. 7, an overcurrent signal monitored by the overcurrent protection circuit 10a is provided as feedback to an input signal end of a drive circuit 20 included in a switching device Q1. As shown in FIG. 7, the overcurrent protection circuit 10a includes a path for providing a voltage value V_b as feedback to a controller 30. The controller 30 controls a switching circuit 1 including the drive circuit 20 and the switching device Q1. As described in the first embodiment, when an overcurrent occurs between a drain terminal D and a source terminal S of the switching device Q1, the voltage value V_b is lowered by overcurrent protection. The overcurrent protection circuit 10a converts, for example, the detected voltage value V_b with an analog-to-digital (A/D) converter 12 to generate a signal V_F. The generated signal V_F is, for example, provided as feedback to the controller 30 as an error signal V_error. The controller 30 can stop or start the overall operation of the power converter including the switching circuit 1 based on, for example, an error signal V_error that is provided as feedback.

As shown in FIG. 7, the signal V_F resulting from conversion by the A/D converter 12 is output as a binary status signal set to 0 when an overcurrent occurs, and set to 1 in a steady state. The status signal can be used to stop the drive circuit 20. More specifically, the overcurrent protection circuit 10a includes a logic device 13 that outputs the logical AND of the control signal V_siga output from the controller 30 and the status signal described above. The overcurrent protection circuit 10a may provide a logic result from the logic device 13 as a control signal V_sigb for the drive circuit 20. When an overcurrent occurs, an output from the logic device 13 (AND output) is in a low status, thus safely stopping the operation of the switching device Q1.

<Fourth Embodiment>

Figure 8:
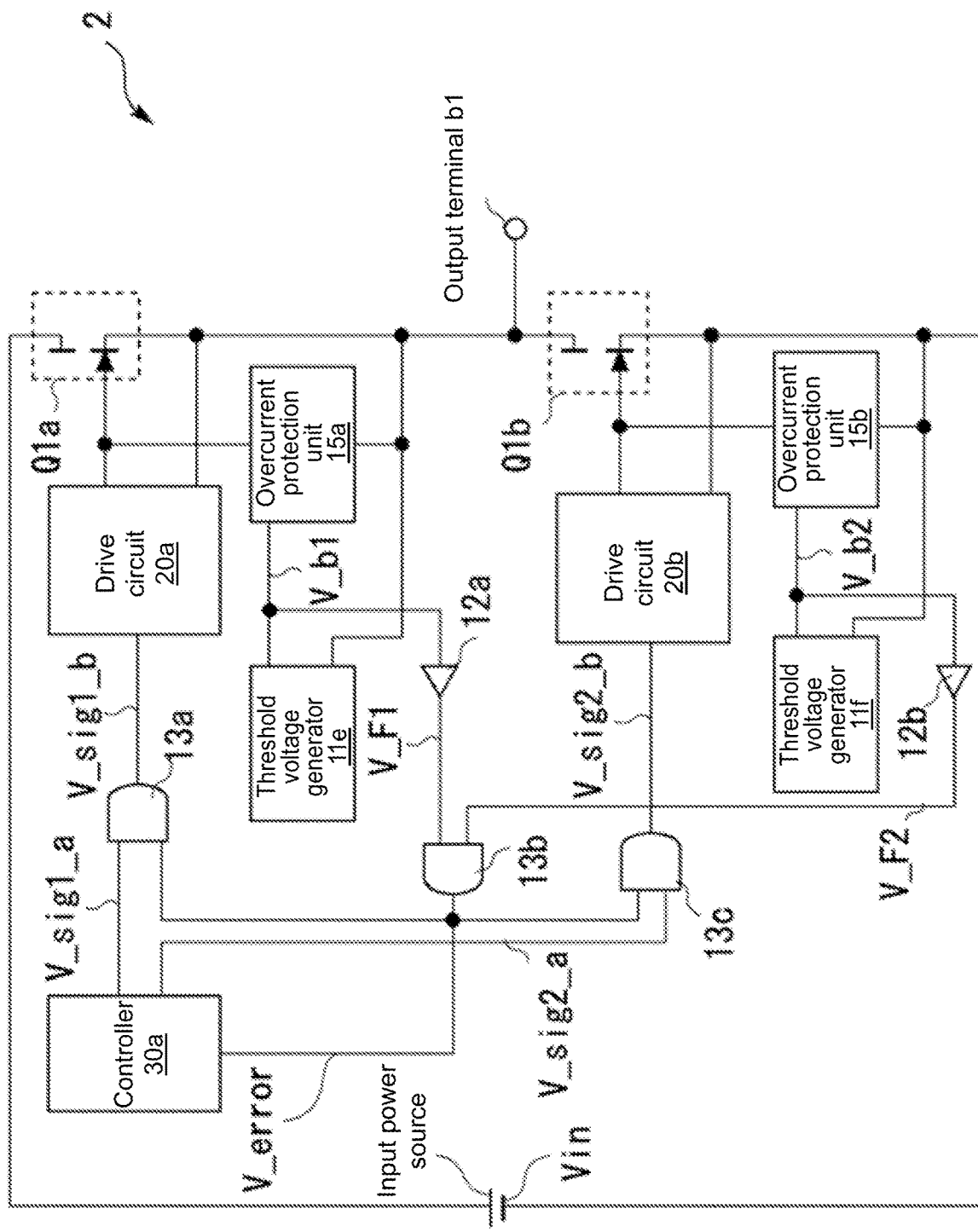
FIG. 8 is a circuit diagram of a half-bridge circuit in a fourth embodiment of the present invention.

FIG. 8 is a circuit diagram of a half-bridge circuit 2 in a fourth embodiment. In the circuit configuration shown in FIG. 8, the half-bridge circuit 2 includes two switching circuits 1 with the structure described in the first embodiment. As shown in FIG. 8, one of the two switching circuits 1 includes a drive circuit 20a, a switching device Q1a, a threshold voltage generator 11e, and an overcurrent protection unit 15a. The other switching circuit 1 includes a drive circuit 20b, a switching device Q1b, a threshold voltage generator 11f, and an overcurrent protection unit 15b. The overcurrent protection units 15a and 15b each have the same structure as the overcurrent protection circuit 10 in the first embodiment excluding the threshold voltage generator 11. In the half-bridge circuit 2 in the fourth embodiment, the two switching circuits 1 operate in cooperation to perform power conversion and output the resulting output to an output terminal b1.

In the structure shown in FIG. 8, an A/D converter 12a converts a detected voltage value V_b1 to generate a signal V_F1. An A/D converter 12b converts a detected voltage value V_b2 to generate a signal V_F2. Each A/D converter outputs, for example, a binary status signal set to 0 when an overcurrent occurs, and set to 1 in a steady state based on the detected voltage value V_b. The output signal from each A/D converter is input into a logic device 13b that outputs the logical AND.

When an overcurrent occurs in any of the two switching circuits, a low status output signal is output from the logic device 13b. In the structure shown in FIG. 8, an output signal from the logic device 13b can be provided as feedback to the controller 30a as an error signal V_error to allow the overall operation of the power converter including the half-bridge circuit 2 to stop or start in a stable manner based on the error signal. In the logic device 13a, the logical AND of the output signal from the logic device 13b and a control signal V_sig1_a output from the controller 30a may be obtained. When an overcurrent occurs in either of the switching circuits, a control signal V_sig1_b as an output from the logic device 13a (AND output) is in a low status, thus safely stopping the operation of the switching device Q1a.

The same applies to a logic device 13c. The logical AND of the output signal from the logic device 13b and a control signal V_sig2_a output from the controller 30a is obtained to safely stop the operation of the switching device Q1b when an overcurrent occurs in either of the switching circuits.

Fifth Embodiment

Figure 9:
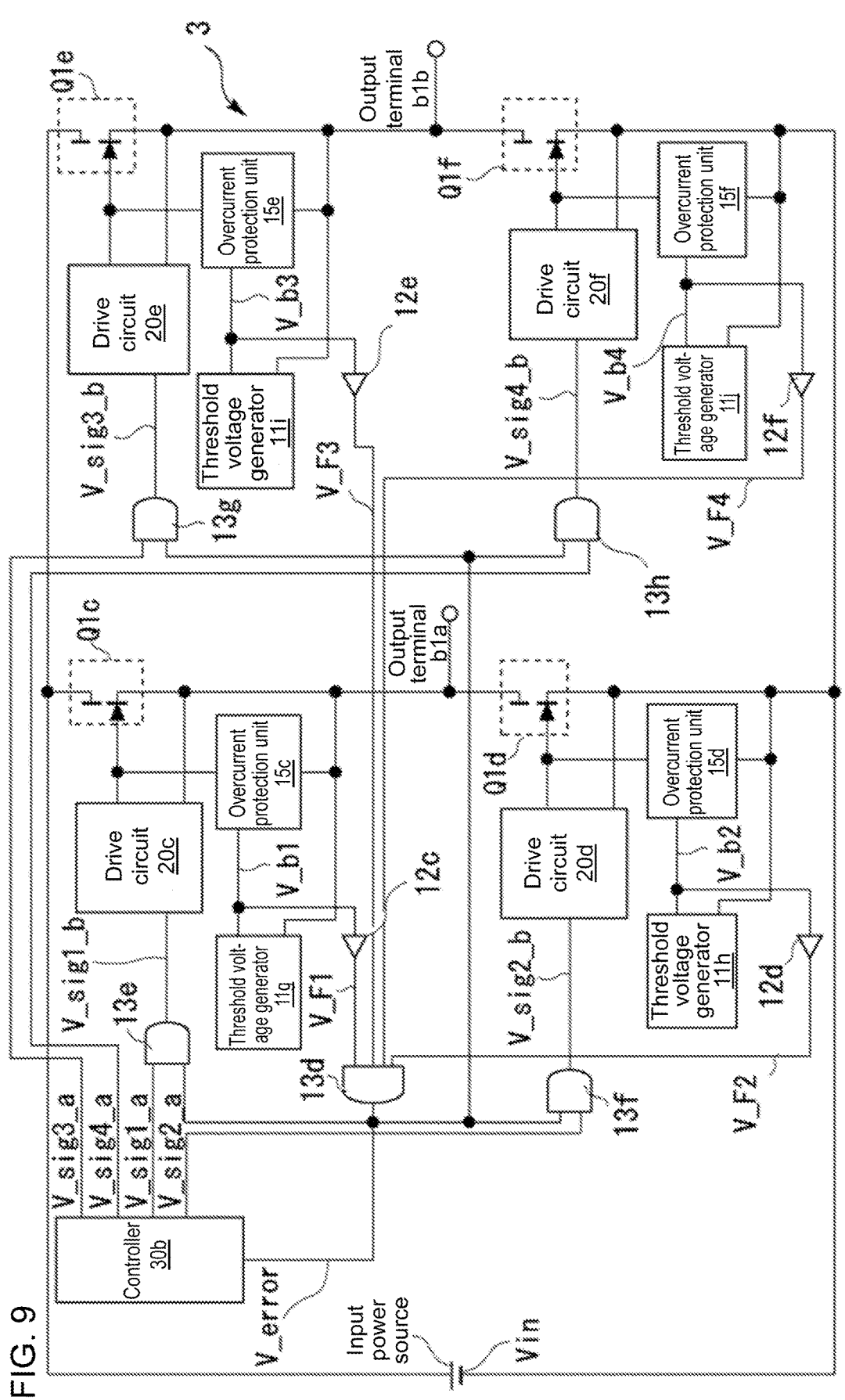
FIG. 9 is a circuit diagram of a full-bridge circuit in a fifth embodiment of the present invention.

FIG. 9 is a circuit diagram of a full-bridge circuit 3 in a fifth embodiment. In the circuit configuration of FIG. 9, a full-bridge circuit 4 includes four switching circuits 1 with the structure described in the first embodiment. A first switching circuit 1 includes a drive circuit 20c, a switching device Q1c, a threshold voltage generator 11g, and an overcurrent protection unit 15c. A second switching circuit 1 includes a drive circuit 20d, a switching device Q1d, a threshold voltage generator 11h, and an overcurrent protection unit 15d. A third switching circuit 1 includes a drive circuit 20e, a switching device Q1e, a threshold voltage generator 11i, and an overcurrent protection unit 15e. A fourth switching circuit 1 includes a drive circuit 20f, a switching device Q1f, a threshold voltage generator 11j, and an overcurrent protection unit 15f. In the full-bridge circuit 3 in the fifth embodiment, the four switching circuits 1 operate in cooperation to perform power conversion and output the resulting output to output terminals b1a and b1b.

In the structure shown in FIG. 9 as well, an A/D converter 12c converts a detected voltage value V_b1 and generates a signal V_F1. An A/D converter 12d converts a detected voltage value V_b2 and generates a signal V_F2. Similarly, an A/D converter 12e converts a detected voltage value V_b3 and generates a signal V_F3, and an A/D converter 12f converts a detected voltage value V_b4 and generates a signal V_F4. Each A/D converter outputs, for example, a binary status signal set to 0 when an overcurrent occurs, and set to 1 in a steady state based on the detected voltage values V_b1 to V_b4. The output signal from each A/D converter is input into a logic device 13d that outputs the logical AND.

When an overcurrent occurs in any of the four switching circuits, a low status output signal is output from the logic device 13d based on the logical AND. In the structure shown in FIG. 9 as well, an output signal from the logic device 13d can be provided as feedback to the controller 30b as an error signal V_error to allow the overall operation of the power converter including the full-bridge circuit 3 to stop or start in a stable manner based on the error signal.

In the logic device 13e, the logical AND of the output signal from the logic device 13d and a control signal V_sig1_a output from the controller 30b may be obtained. When an overcurrent occurs in either of the switching circuits, a control signal V_sig1_b as an output from the logic device 13e (AND output) is in a low status, thus safely stopping the operation of the switching device Q1c.

The same applies to the logical devices 13f, 13g, and 13h. The logical AND of the output signal from the logic device 13d and control signals V_sig2_a, V_sig3_a, and V_sig4_a output from the controller 30b is obtained to safely stop the operations of the switching devices Q1d, Q1e, and Q1f.

(Others)

The above embodiments are mere examples. The embodiments may be appropriately changed without departing from the spirit and scope of the disclosure. The processing or the units described herein may be combined in any manner unless such combinations cause technical conflicts between them.

A process performed by a single circuit or a single device may be performed by multiple circuits or multiple devices in a shared manner. Processes performed by different circuits or different devices may be performed by a single circuit or a single device.

The elements in the aspects of the present invention below are identified with reference numerals used in the drawings to show the correspondence between these elements and the components in the embodiments.

<Aspect 1>

An overcurrent protection circuit (10) for a switching device (Q1) including a first terminal (Q1, G) to receive a control signal input into the first terminal (Q1, G), and a second terminal (Q1, D) and a third terminal (Q1, S) to be electrically connected to each other or electrically disconnected from each other based on the input control signal, the overcurrent protection circuit (10) comprising:

a first switching element (Q2) including a fourth terminal (Q2, G) to receive an input of a predetermined threshold voltage, a sixth terminal (Q2, S) connected to the first terminal (Q1, G) of the switching device (Q1), and a fifth terminal (Q2, D); and a second switching element (Q3) including a seventh terminal (Q3, G) connected to the fifth terminal (Q2, D) of the first switching element (Q2), an eighth terminal (Q3, D) connected to the fourth terminal (Q2, G), and a ninth terminal (Q3, S), wherein the first switching element (Q2) electrically connects the sixth terminal (Q2, S) and the fifth terminal (Q2, D) in response to detecting a voltage value between the first terminal (Q1, G) and the third terminal (Q1, S) of the switching device (Q1) exceeding a predetermined threshold based on the predetermined threshold voltage input into the fourth terminal (Q2, G), and the second switching element (Q3) electrically connects, in response to the sixth terminal (Q2, S) and the fifth terminal (Q2, D) of the first switching element (Q2) being electrically connected to each other, the eighth terminal (Q3, D) and the ninth terminal (Q3, S) to lower the predetermined threshold voltage input into the fourth terminal (Q2, G) of the first switching element (Q2).

REFERENCE SIGNS LIST 1, 100 switching circuit
2 half-bridge circuit
3 full-bridge circuit
10 overcurrent protection circuit
11 threshold voltage generator
20 drive circuit
D1, D2 diode
Q101, Q1, Q2, Q3 switching device
R1, R2, R3 resistance

The invention claimed is:

1. An overcurrent protection circuit for a switching device including a first terminal to receive a control signal input into the first terminal, and a second terminal and a third terminal to be electrically connected to each other or electrically disconnected from each other based on the input control signal, the overcurrent protection circuit comprising:

a first switching element including a fourth terminal to receive an input of a predetermined threshold voltage, a sixth terminal connected to the first terminal of the switching device, and a fifth terminal;

a second switching element including a seventh terminal connected to the fifth terminal of the first switching element, an eighth terminal connected to the fourth terminal, and a ninth terminal;

a first resistance having one end directly connected to the fifth terminal of the first switching element; and a first diode including an anode terminal directly connected to another end of the first resistance and a cathode terminal directly connected to the fourth terminal of the first switching element, wherein the first switching element electrically connects the sixth terminal and the fifth terminal in response to detecting a voltage value between the first terminal and the third terminal of the switching device exceeding a predetermined threshold based on the predetermined threshold voltage input into the fourth terminal, the second switching element electrically connects, in response to the sixth terminal and the fifth terminal of the first switching element being electrically connected to each other, the eighth terminal and the ninth terminal to lower the predetermined threshold voltage input into the fourth terminal of the first switching element, and the first switching element controls a current flowing into the eighth terminal of the second switching element with the sixth terminal and the fifth terminal electrically connected to each other.

2. The overcurrent protection circuit according to claim 1, further comprising:
a threshold voltage generator including
a second resistance connected to one of a positive electrode or a negative electrode of a power supply for generating a control signal to be input into the first terminal, and
a first capacitor and a second diode connected in parallel between the second resistance and the other of the positive electrode or the negative electrode of the power supply,
the threshold voltage generator being configured to generate the predetermined threshold voltage to be input into the fourth terminal of the first switching element.

3. The overcurrent protection circuit according to claim 1, further comprising:
a feedback circuit configured to detect a voltage decrease resulting from discharge of the predetermined threshold voltage input into the fourth terminal of the first switching element, and stop or start generation of the control signal to be input into the first terminal.

4. The overcurrent protection circuit according to claim 1, wherein
the first switching element includes a p-type metal-oxide-semiconductor field-effect transistor, the fourth terminal is a gate terminal, the fifth terminal is a drain terminal, and the sixth terminal is a source terminal, and
the second switching element includes an n-type metal-oxide-semiconductor field-effect transistor, the seventh terminal is a gate terminal, the eighth terminal is a drain terminal, and the ninth terminal is a source terminal.

5. A power converter, comprising:
a switching device including a first terminal to receive a control signal input into the first terminal, and a second terminal and a third terminal to be electrically connected to each other or electrically disconnected from each other based on the input control signal; and
an overcurrent protection circuit comprising:
a first switching element including a fourth terminal to receive an input of a predetermined threshold voltage, a sixth terminal connected to the first terminal of the switching device, and a fifth terminal;
a second switching element including a seventh terminal connected to the fifth terminal of the first switching element, an eighth terminal connected to the fourth terminal, and a ninth terminal;
a first resistance having one end directly connected to the fifth terminal of the first switching element; and
a first diode including an anode terminal directly connected to another end of the first resistance and a cathode terminal directly connected to the fourth terminal of the first switching element,
wherein the first switching element electrically connects the sixth terminal and the fifth terminal in response to detecting a voltage value between the first terminal and the third terminal of the switching device exceeding a predetermined threshold based on the predetermined threshold voltage input into the fourth terminal,
the second switching element electrically connects, in response to the sixth terminal and the fifth terminal of the first switching element being electrically connected to each other, the eighth terminal and the ninth terminal to lower the predetermined threshold voltage input into the fourth terminal of the first switching element, and
the first switching element controls a current flowing into the eighth terminal of the second switching element with the sixth terminal and the fifth terminal electrically connected to each other.

* * * * *